United States Patent
Yokoyama

(10) Patent No.: US 6,281,445 B1
(45) Date of Patent: Aug. 28, 2001

(54) DEVICE AND METHOD FOR CONNECTING TWO ELECTRONIC COMPONENTS

(75) Inventor: Takashi Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/352,321

(22) Filed: Jul. 12, 1999

(30) Foreign Application Priority Data

Jul. 13, 1998 (JP) .................................................. 10-197086

(51) Int. Cl.⁷ ....................................................... H05K 1/00
(52) U.S. Cl. .......................... 174/250; 174/260; 174/256; 361/767; 361/768; 361/771; 361/807
(58) Field of Search .................... 174/252, 262, 174/260, 138 G, 256, 250; 361/767, 768, 771, 808, 811, 809, 807

(56) References Cited

U.S. PATENT DOCUMENTS 5,372,953    12/1994   Matsuoka .

FOREIGN PATENT DOCUMENTS

| 4-155866 | 5/1992 | (JP) . |
| 5-62979  | 3/1993 | (JP) . |
| 5-235099 | 9/1993 | (JP) . |

*Primary Examiner*—Albert W. Paladini
*Assistant Examiner*—Kamand Cuneo
(74) *Attorney, Agent, or Firm*—Foley & Lardner

(57) ABSTRACT

A connection device for use in connection between two electronic components and a connection device provided on a first electronic component. The connection device includes two metal layers which have mutually different coefficients of thermal expansion, and a plurality of side wall pieces that are provided on the metal layers so as to form a connecting space for a second electronic component.

7 Claims, 6 Drawing Sheets

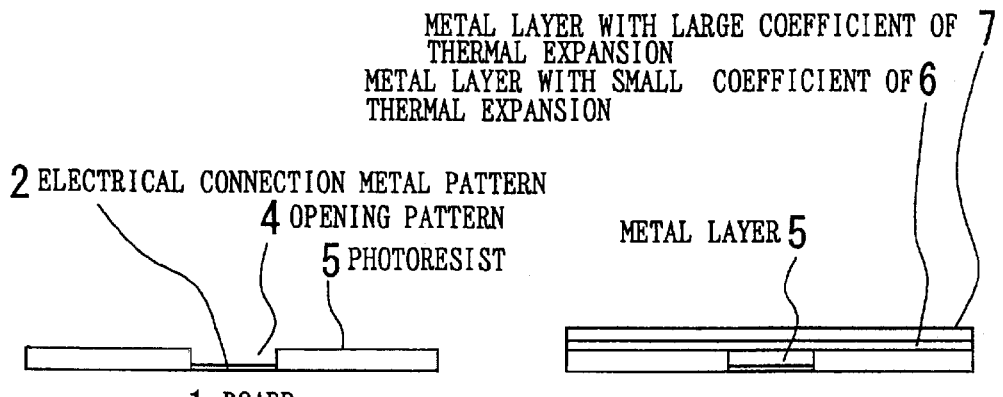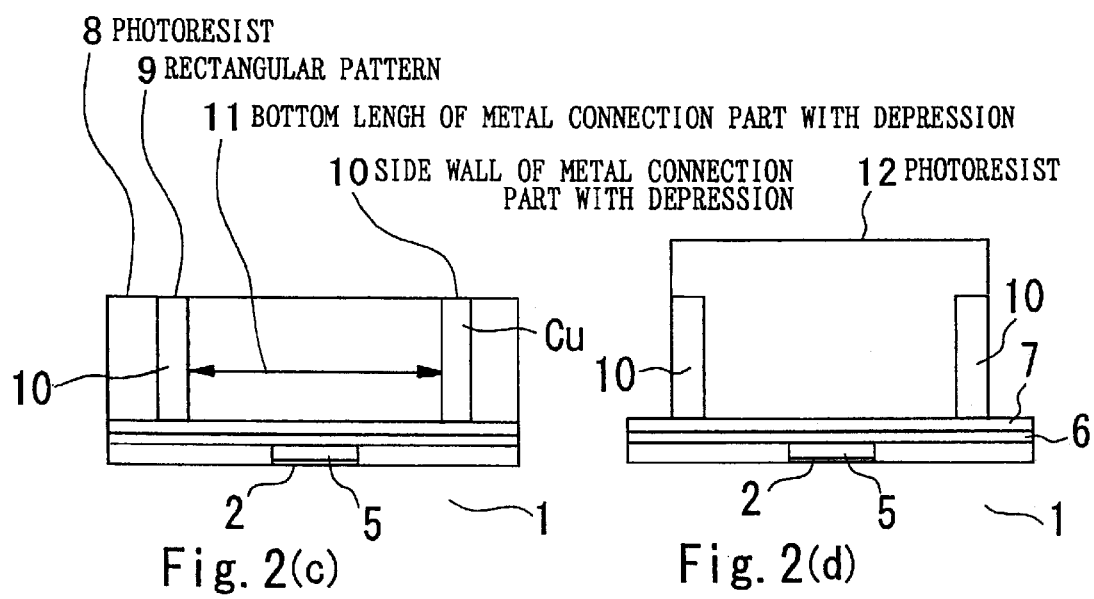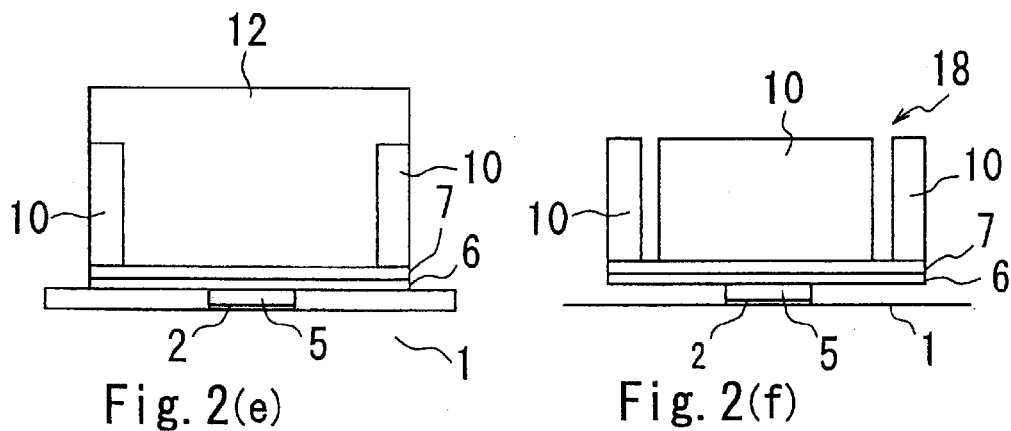

DEVICE AND METHOD FOR CONNECTING TWO ELECTRONIC COMPONENTS

BACKGROUND OF THE INVENTION

1. Field of the Invention

The present invention relates to a device and a method for making connection between two electronic components, and more specifically to a connection device that enables easy connection to and removal from a board of an electronic component such as an LSI device, and to an associated method of connection.

2. Description of the Related Art

In recent years, dramatic advances have been made in the fields of computers and communication equipment, these advances made possible by great improvement in the performance of devices such as LSI devices and other various electronic components used in such equipment. Advances in the performance of LSI devices have played a particularly important role. The mother boards of computers, for example, contain a large number of LSI devices. An LSI chip is usually housed in a package of ceramic or the like, with connection made thereto using the wiring bonding method, the ceramic package being mounted onto a printed circuit board. However, because the package is extremely large compared to the LSI chip, it requires a large amount of space to mount on the board. This mounting method is not only disadvantageous from the standpoint of achieving compact electronic apparatus, but also results in a lengthening of circuit lengths, this preventing the achievement of efficient signal processing. Additionally, in a microprocessor that operates at a high speed, because of the large number of connection points that are required, it is not possible to meet this requirement using the wire bonding method. The flip-chip bonding method was developed to solve these problems of reducing the mounting surface area, establishing a large number of connection points, and reducing the connection lengths to shorten the signal delay.

The flip-chip bonding method is a method whereby solder bumps are formed by either plating or deposition on an LSI chip or on the connection part of the board, the LSI chip and board being connected by fusing the joint formed thereby. Once the LSI chip is mounted by this method, however, there is problem that it is extremely difficult to remove. If heat is applied, the solder can be melted, enabling removal of the LSI chip. However, part of the solder remains on the board, so that when a good LSI or an upgraded LSI chip is mounted on the board, deterioration of the old solder tends to cause a bad electrical connection. When a solder that include lead is used, alpha radiation from radioactive elements such as uranium and lithium that are included in minute amounts in the lead can cause faulty operation of a semiconductor element. In the case of using solder bumps, because of a CFC solvent used to remove a reducing agent such as flux that is used when making the connection, there is the possibility of exerting an deleterious effect on the global environment.

The previously used flip-chip method will be described with reference to FIG. 6. As a method of connecting an LSI chip to a board, a eutectic solder bump made of tin and lead formed on the LSI chip is caused to come into contact with the board, a flux which is a reducing agent is applied, and a fusion bond is made at a temperature of approximately 200° C. (FIG. 6(a)). Then, a CFC solvent is used to remove this flux. The use of the above-noted CFC solvent is not desirable from the standpoint of protecting the global environment. Additionally, within the solder bumps, which contain lead, there is a minute amount of radioactive elements, which cause the problem of faulty operation of semiconductor elements (FIG. 6(b)). Additionally, when the joint is melted so as to remove the LSI chip, there is the problem that solder remaining on the board results in faulty connections. (FIG. 6(c)).

As described above, the prior art flip-chip method had a large number of problems.

Accordingly, it is an object of the present invention to improve on the above-noted drawbacks of the prior art, by providing a novel connection device for facilitating the connection of an electronic component such as an LSI chip to a board and removal of an electronic component from a board, enabling repeated connection thereto and removal therefrom, while providing a stable electrical contact. It is a further object of the present invention to provide a method for making the above-noted connection.

SUMMARY OF THE INVENTION

In order to achieve the above-noted objects, the present invention adopts the following basic technical constitution.

Specifically, the first aspect of the present invention is a connection device for use in connection between a first electronic component and a second electronic component, said connection device being provided on said first electronic component, said first electronic component comprising two metal layers having mutually different coefficients of thermal expansion, and a plurality of side wall pieces provided on said metal layers so as to form a connecting space to be used for connecting said first electronic component to said second electronic component.

In the second aspect of the present invention, said two metal layers having mutually different coefficients of thermal expansion are fixed to a metal layer that is provided on said first electronic component.

In the third aspect of the present invention, the approximately center portion of said two metal layers having mutually different coefficients of thermal expansion is fixed to a metal layer that is provided on said first electronic component.

In the fourth aspect of the present invention, a gap is provided between said metal layers and a surface of said first electronic component.

In the fifth aspect of the present invention, of said two metal layers having mutually different coefficients of thermal expansion, the coefficient of thermal expansion of said metal layer provided on said side wall side is larger than the coefficient of thermal expansion of said metal layer fixed to said metal layer provided on said first electronic component, and further wherein an aperture of said connecting space formed by said side wall pieces extends when heat is applied to said connection device.

In the sixth aspect of the present invention, either of said two electronic component is a semiconductor device.

A method according to the present invention is a method for making a connection between a first electronic component and a second electronic component, wherein said first electronic component having two metal layers having mutually different coefficients of thermal expansion, and a plurality of side wall pieces that are provided on said metal layers so as to form a connecting space for said second electronic component, said method comprising; a first step of extending an aperture of said connecting space formed by said side wall pieces by applying heat to said two metal layers, a second step of inserting a connection member of said second electronic component into said connecting space, and a third step of narrowing said aperture of said connecting space by cooling said two metal layers.

In the method for connection between an electronic component and a board according to the present invention, the shape of a flip-chip bump formed on an LSI chip or on a board is made so that one end has a depression, with the other end having a pillar shape that mates with a depression. The base part of the depression shape is formed by a two-layer metal structure in which the two layers have different coefficients of thermal expansion, with the upper layer being made of a metal with a large coefficient of thermal expansion and the lower layer being made of a metal with a small coefficient of thermal expansion, so that temperature control can be used to control connection between two electronic components.

By doing the above, it is possible to achieve a flip-chip connection without the need for a fused solder connection, thereby enabling repeated connection and removal of an LSI chip without damage to the electrical connection point. Additionally, because there is no need to use a solder material that includes lead, faulty LSI device operation caused by alpha radiation from minute amounts of radioactive elements such as uranium and lithium included in lead is eliminated. Another advantage of this method is that, because there is no need to use a reducing agent flux when making the connection, there is no need to use a CFC type solvent to remove the flux.

BRIEF DESCRIPTION OF THE DRAWINGS

FIGS. 2(a) through 2(f) illustrate the method for manufacturing the depression shaped metal connection part of a connection device according to the present invention.

DESCRIPTION OF THE PREFERRED EMBODIMENTS

Figure 1A:
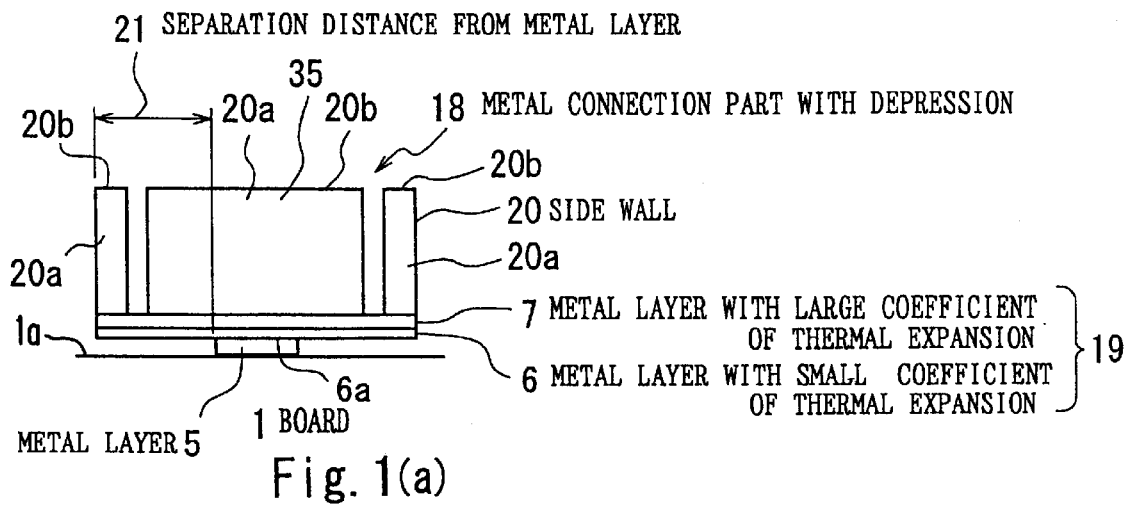
FIGS. 1(a) through 1(e) illustrate the operation of a connection device for use between an electronic component and a board according to the present invention.

Embodiments of a connection device and a method for use in connection between two electronic components according to the present invention are described in detail below, with references made to relevant accompanying drawings.

FIG. 1 shows the construction of an embodiment of a device for connection between an electronic device and a board, according to the present invention.

FIG. 1 shows a connection device for use in connection between two electronic components 1 and 40, the connection device provided on a first electronic component 1 comprising two metal layers 6 and 7 having mutually different coefficients of thermal expansion, and a plurality of side wall pieces 20a that are provided on the metal layers 6 and 7 so as to form a connecting space 35 for a second electronic component 40.

FIG. 1 shows a connection device for use between two electronic components, wherein the approximately center portion 6a of said two metal layers 6 and 7 having mutually different coefficients of thermal expansion is fixed to a metal film 5 that is provided on said first electronic component 1.

FIG. 1 shows a connection device, wherein a gap is provided between the metal layers 6 and 7 and a surface 1a of the first electronic component 1.

Additionally, FIG. 1 shows a connection device for use between two electronic components, wherein, of the two metal layers 6 and 7 having mutually different coefficients of thermal expansion, the layer 7 has coefficient of thermal expansion that is greater than that of the layer 6 which is fixed to the metal layer 5 that is formed on the electronic component 1, so that when heat is applied, the aperture 20b of the connecting space 35 surrounded by the side walls 20 extends.

The first embodiment of the present invention is described in further detail below, with references being made to FIG. 1 through FIG. 3.

By forming a depression in a structure of two metal layers that have mutually different coefficients of thermal expansion and four side walls, the present invention enables the repeated connection and removal of an LSI chip via temperature control without the use of a solder material.

Figures 1B, 1C:
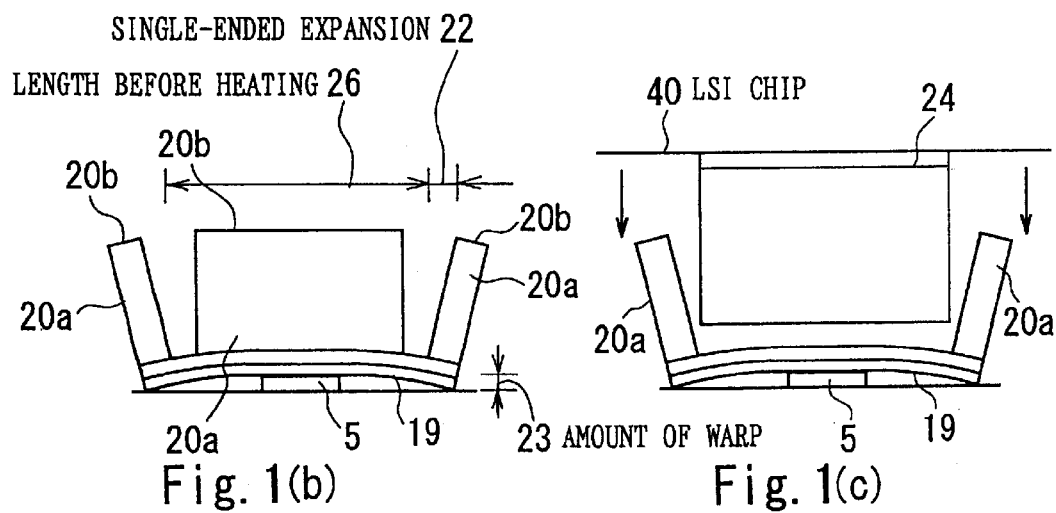
Figures 1D, 1E:
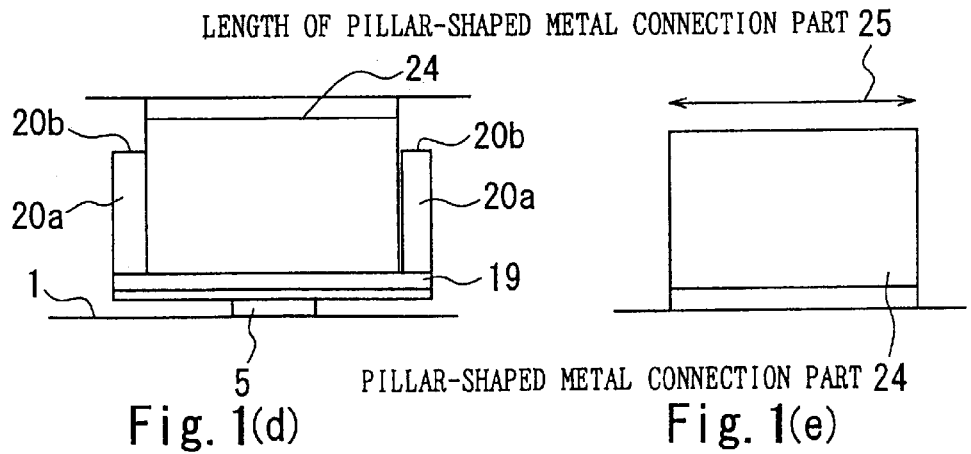

First, as shown in FIG. 1(a), a depression is formed in a metal connection part on the board side, and a pillar shape (FIG. 1(d)) is formed in a metal connection part on the LSI chip side so as to correspond to the depression. By forming these shapes, it is possible to have these shapes mate with each other when the LSI chip is connected to the board. The metal connection part on the board side that has the depression is formed by the base part 19 and a side wall 20, the base part 19 being formed by two metal layers 6 and 7, which have mutually different coefficients of thermal expansion. Of these layers, a metal having a large coefficient of thermal expansion is used for the metal layer 6, which is the lower layer. Selection of the metals can be made from such metals as copper, aluminum, nickel, and titanium, with consideration given to the coefficients of thermal expansion of these metals, and in this case copper and nickel were selected, the associated coefficients of thermal expansion being 17 ppm and 13 ppm, respectively. Additionally, a metal film 5 enables the metal connection part 18 with the depression to be disposed at some distance from the board 1. If heat is applied to a metal connection part 18 with a depression, in accordance with the coefficients of thermal expansion of the metal layers 6 and 7, the metal connection part 18 will attempt to expand in a direction that is parallel to the board. If the distance 21 from the metal layer 5 is 100 $\mu$m and the temperature is raised from room temperature to 350° C., the single-ended expansion will be approximately 0.5 $\mu$m. Additionally, because of the difference in coefficients of thermal expansion between the two laminations of metal layer that from the base part 19, if the thickness of each layer is 2 $\mu$m, the amount of warp 23 will be in the approximate range of 0.3 to 0.5 $\mu$(FIG. 1(b)). Using a metal connection part 18 formed with a depression as described herein, a pillar-shaped metal connection part 24, made of a metal such as copper, of an LSI 40 is joined to the metal connection part 18 having the depression (FIG. 1(c)). If the temperature drops thereafter, the metal connection part 18 with the depression returns to its original shape, thereby tightening onto the pillar-shaped metal connection part 24 so as to achieve an electrical joint. If the width 25 of the pillar-shaped metal connection part 24 is made greater than the length of the metal connection part 18 with the depression before the rise in temperature, but less than that length when increased in temperature, it is possible to achieve a secure connection in the usual condition.

By using the above-noted connection structure and process, it is easy to replace an LSI chip, and it is possible to repeatedly connect and remove an LSI chip.

The method of manufacturing the metal connection part 18 with the depression is described below, with reference being made to FIG. 2. First, photoresist 3 is applied to a thickness of several microns to a substrate of silicon or ceramic, or to a printed circuit board having an electrical connection pattern 2 for making connection to an electronic component such as an LSI chip, and a known lithographic process is used to form a photoresist opening pattern 4 having a diameter in the range form 20 to 50 μm (FIG. 2(*a*)). Then, electroplating is used to fill the pattern 4 with nickel, thereby forming the metal layer 5, after which sputtering or deposition is used to form a metal film 6 made of nickel, which has a small coefficient of thermal expansion, to a thickness of 2 to 3 μm, and then form a metal film 7 of copper, which has a large coefficient of thermal expansion, to a thickness of 2 to 3 μm (FIG. 2(*b*)). Next, photoresist or a dry film 8 is applied or laminated, respectively, to a thickness of 30 to 50 μm, so as to form a rectangular pattern having a length of 10 to 30 μm and a width of 100 to 200 μm, this pattern being then filled with copper, by means of electroplating. This copper will form the side wall 10 on the metal connection part with the depression, and the length 11 of the bottom part of the this metal connection part will be 100 to 300 μm (FIG. 2(*c*)). Then, the photoresist or dry film is peeled off, and photoresist 12 is applied anew, so as to perform patterning that covers the metal connection part 18 with the depression by the photoresist 12 (FIG. 2(*d*)). This pattern is used as a mask to remove the copper and nickel using a wet acid solution (FIG. 2(*e*)), the photoresist 12 and photoresist 3 are removed, thereby completing the metal connection part 18 with the depression (FIG. 2(*f*)).

Figure 3A:
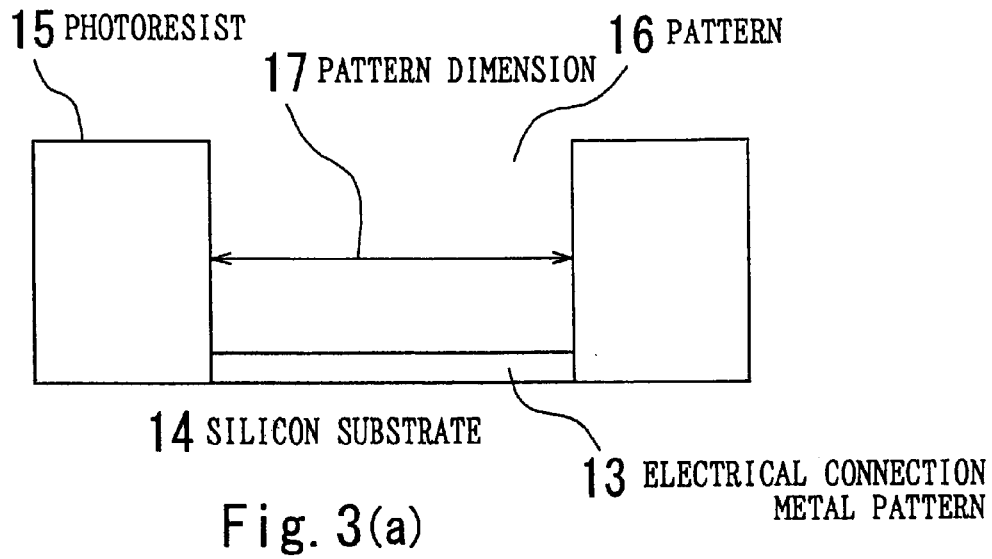
FIGS. 3(a) through 3(c) illustrate the method for manufacturing the pillar-shaped metal connection part of a connection device according to the present invention.
Figure 3B:
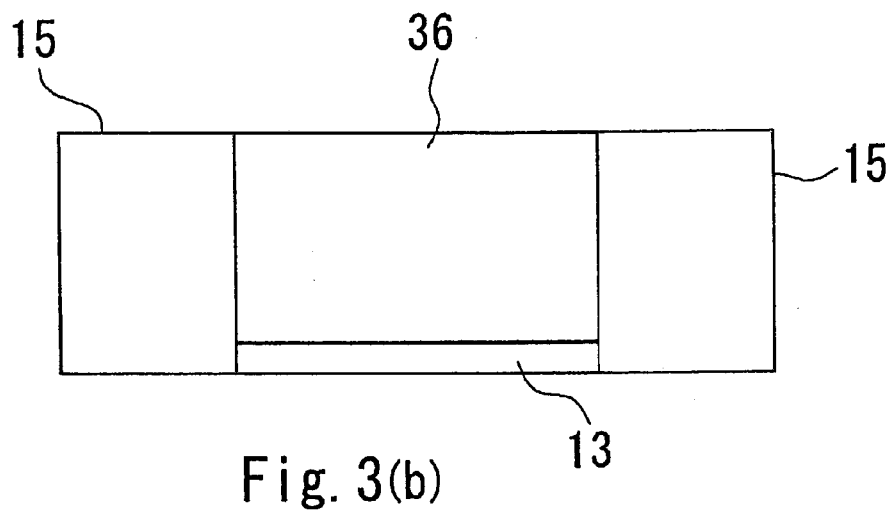
Figure 3C:
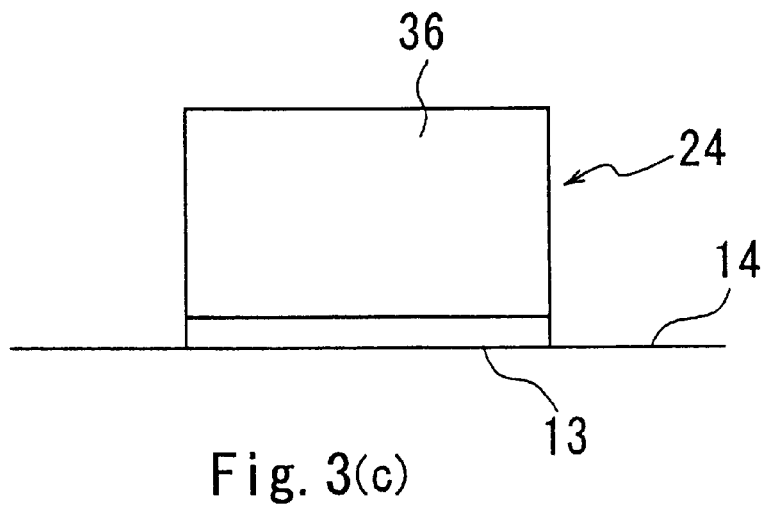

Turning to FIG. 3, the method of forming the pillar-shaped metal connection part on the LSI side is described below. First, photoresist 15 is applied to a thickness of 30 to 80 μm to a silicon substrate 14 that has an electrical connection pattern 13, and lithography is used to form a pattern 16 thereon (FIG. 3(*a*)). In order for this pattern 16 to serve as the pillar-shaped metal connection part, the shape is made the same as the bottom part of the depression in the metal connection part 18. Note, however, that the horizontal dimension 17 is sometimes made larger by approximately 0.1 to 0.2 μm. Next, copper plating is done to fill the pattern 16 with copper (FIG. 3(*b*)), after which the photoresist 15 is removed.

The above steps complete the fabrication of the pillar-shaped metal connection part 24.

The joining of the metal connection part 18 with the depression and the pillar-shaped metal connection part 24 is as described above.

Note that, although this embodiment is described for the case in which the metal connection part 18 with the depression is formed on the board side and the pillar-shaped metal connection part 24 is formed on the LSI chip, it is also possible to form the pillar-shaped metal connection part on the board and form the metal connection part with the depression on the LSI chip.

Additionally, although the description of the above-noted embodiment was for the case in which copper was used as the metal having a large coefficient of thermal expansion and nickel was used as the metal having a small coefficient of thermal expansion, the present invention does not present restrictions with regard to this choice metals. Additionally, it should be noted that, although copper is used in the above-noted embodiment for the pillar-shaped metal connection part 23, the metal of the pillar-shaped metal connection part 24 is not restricted to copper.

The second embodiment of the present invention is described below, with references being made to FIG. 4 and FIG. 5.

This embodiment of the present invention is a method for pre-fabricating a large number of metal connection parts with depressions, the manufacturing method for which is complex, and for connecting these metal connection parts with depressions to a board. As shown in FIG. 4(*a*), a solder layer 27 is formed on a board 1, which has a metal connection pattern 2. Based on the thermally controlled operation of the metal connection pert 18A, which was described earlier, it is desirable that the solder material used have a high melting point (327° C. in the case of a solder having a Pb/Sn ratio of 95/5). This solder layer 27 is fused to the metal connection part 18 with the depression, which had been formed beforehand (FIG. 4(*b*)).

Then, the method of making connection to the pillar-shaped metal connection part 24 of the LSI chip is the same as was described with regard to the first embodiment. Note, however, that it is necessary to set the temperature used for connecting and disconnecting the LSI chip to a temperature that does not melt the solder.

Next, the method of manufacturing the metal connection part 18A with the depression, as used in the second embodiment, will be described. First, photoresist 29 is applied to a silicon substrate 28. Then, a metal with a small coefficient of thermal expansion and then a metal with a large coefficient of thermal expansion, such as nickel and copper, are continuously formed in this sequence, to a thickness of 1 to 2 μm each (FIG. 5(*a*)). Next, photoresist 30 is applied and patterned, so as to form the side wall 10 of the metal connection part with the depression, and a plating method is used to fill this pattern with copper (FIG. 5(*b*)). After removing the photoresist 30, the large number of metal connection parts with depressions are diced to break them away from each other into individual parts (FIG. 5(*c*)). Then, immersion is done into photoresist peeling solution 31, so as to separate the metal connection parts 18A with depressions from the substrate 28.

Figure 4A:
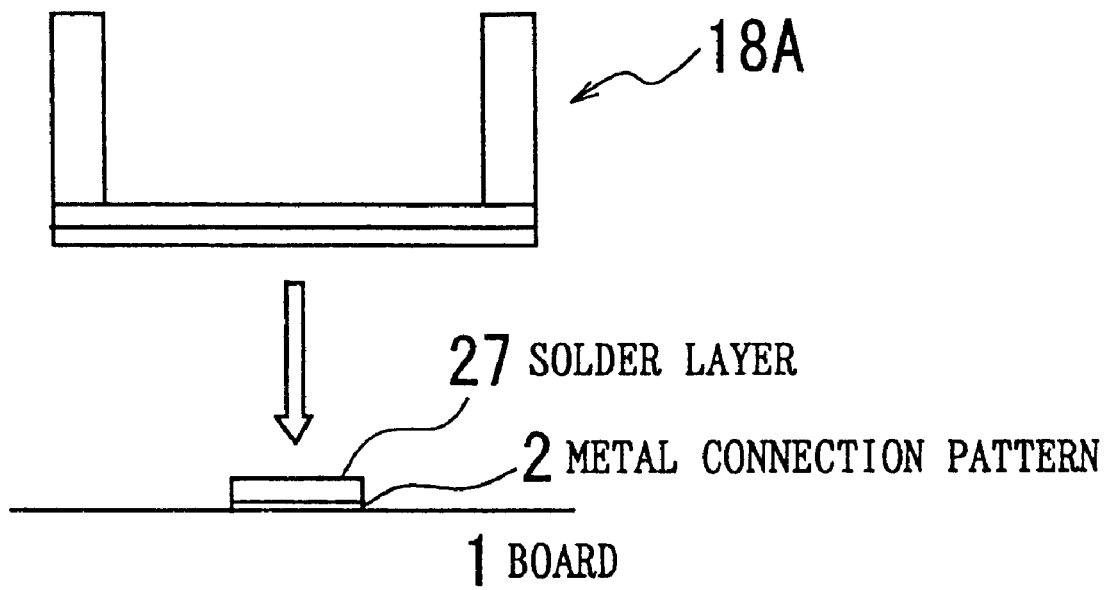
FIGS. 4(a) through 4(b) illustrate a second embodiment of a connection device according to the present invention.
Figure 4B:
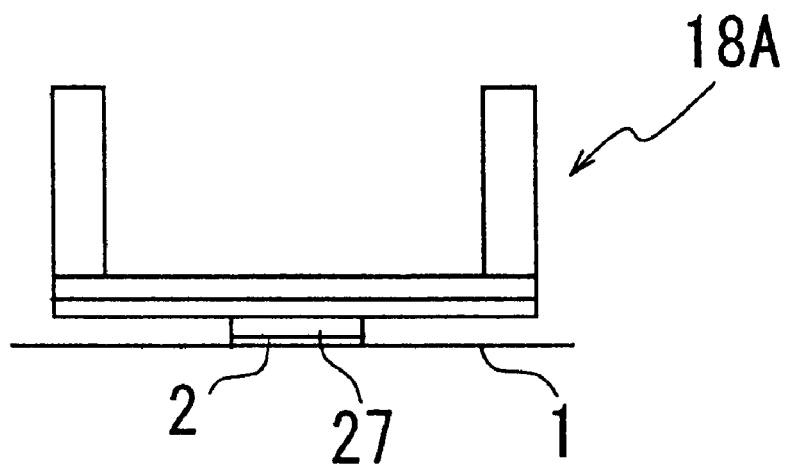
Figure 5A:
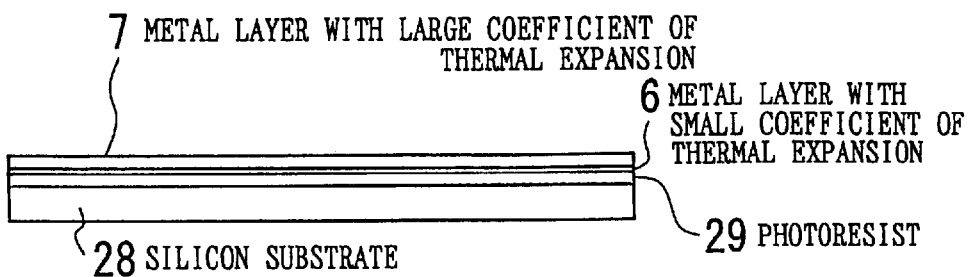
FIGS. 5(a) through 5(d) illustrate the method for manufacturing the depression-shaped metal connection part of FIGS. 4(a) and 4(b)
Figure 5B:
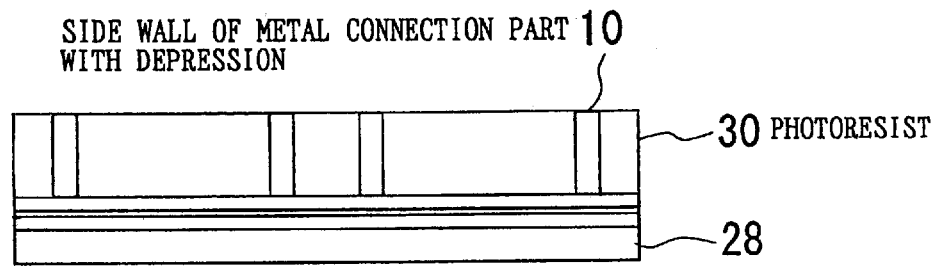
Figure 5C:
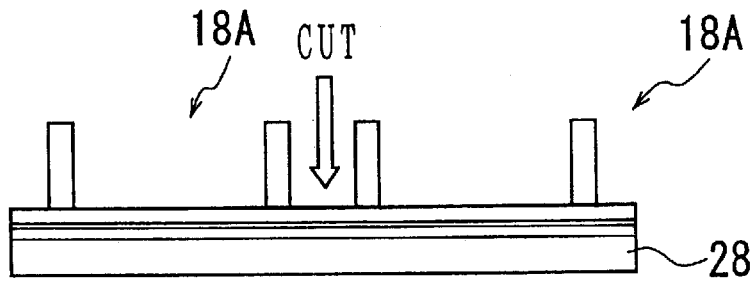
Figure 5D:
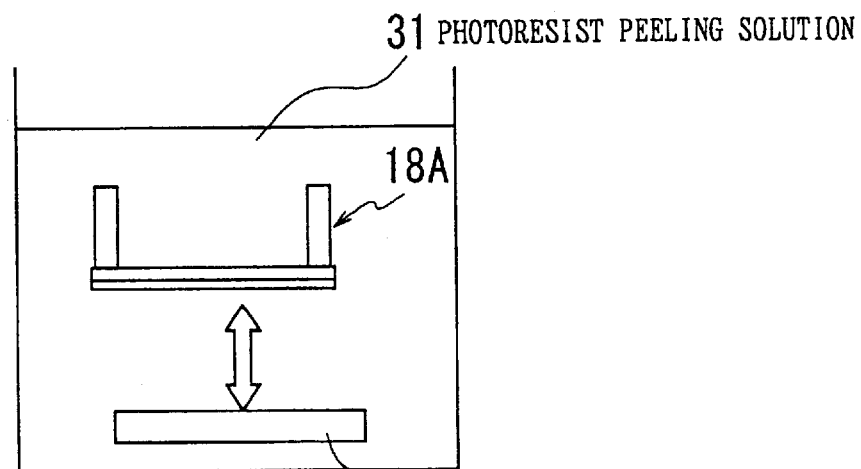
Figure 6A:
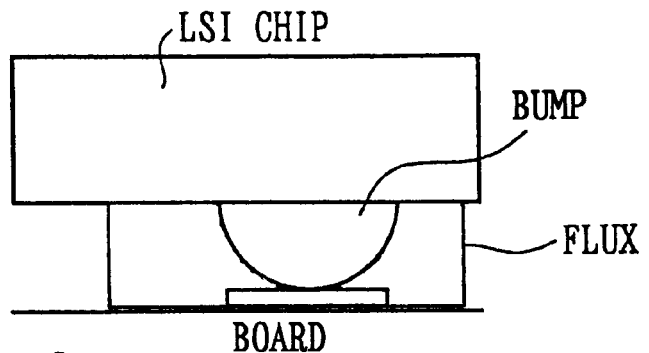
FIGS. 6(a) through 6(c) illustrate the prior art.
Figure 6B:
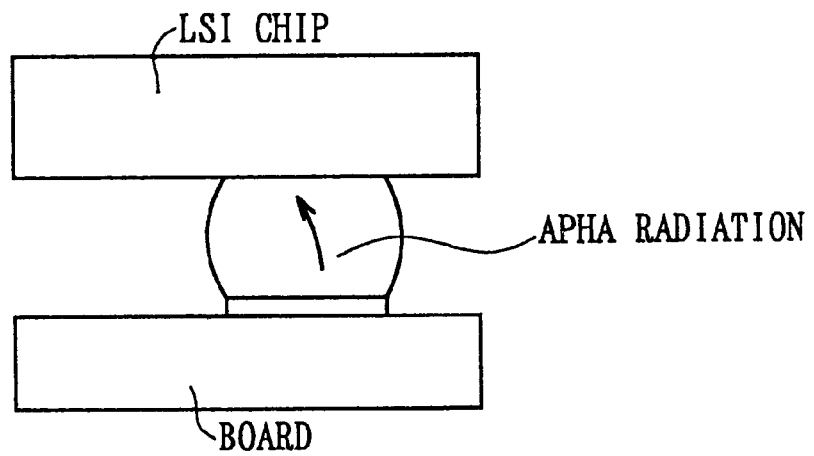
Figure 6C:
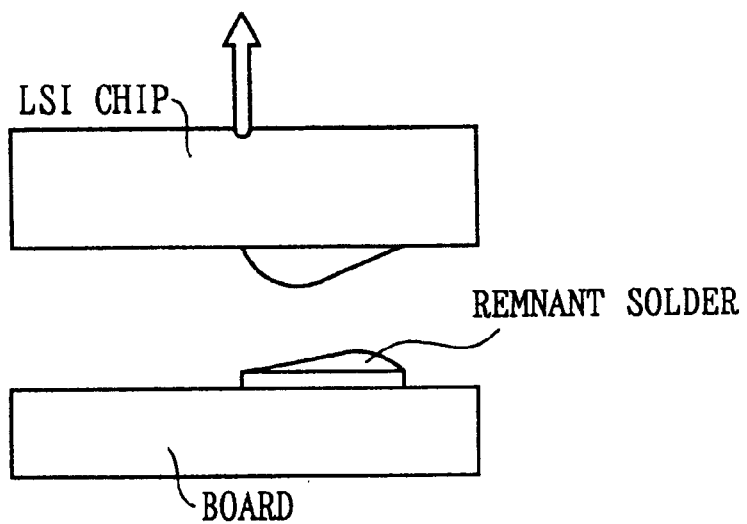

Finally, as shown in FIG. 4, connection is made to the solder layer 27 of a circuit board 1.

By adopting the above-described constitution, a connection device according to the present invention enable connection of an LSI chip to and removal of an LSI chip from a board, these operations being repeatedly performable using temperature control. Additionally, because there is absolutely no deterioration of the LSI chip metal connection part when connection to or removal from a board is performed, re-use is possible. Because a solder material which includes tin and lead is not used, there is no need to use flux as a reducing agent when making a fused connection, thereby eliminating the use of an CFC solvent to remove the flux. Additionally, by not using lead, faulty operation of a semiconductor element caused by the influence of radioactive elements contained in the lead is eliminated.

By virtue of the above-noted constitution adopted in the second embodiment of the present invention, it is possible by separating the manufacturing of the board and the metal connection part with the depression, to greatly improve amenability to mass production.

What is claimed is:

1. A connection device for use in connection between a first electronic component and a second electronic component, said connection device being provided on said first electronic component, said first electronic component comprising two metal layers having mutually different coefficients of thermal expansion, and a plurality of side wall pieces provided on said metal layers so as to form a connecting space to be used for connecting said first electronic component to said second electronic component.

2. A connection device according to claim 1, wherein said two metal layers having mutually different coefficients of thermal expansion are fixed to a metal layer that is provided on said first electronic component.

3. A connection device according to claim 1, wherein the approximately center portion of said two metal layers having mutually different coefficients of thermal expansion is fixed to a metal layer that is provided on said first electronic component.

4. A connection device according to claim 1, wherein a gap is provided between said metal layers and a surface of said first electronic component.

5. A connection device according to claim 1, wherein, of said two metal layers having mutually different coefficients of thermal expansion, the coefficient of thermal expansion of said metal layer provided on said side wall side is larger than the coefficient of thermal expansion of said metal layer fixed to said metal layer provided on said first electronic component, and further wherein an aperture of said connecting space formed by said side wall pieces extends when heat is applied to said connection device.

6. A connection device according to claim 1, wherein either of said two electronic component is a semiconductor device.

7. A method for making a connection between a first electronic component and a second electronic component, wherein said first electronic component having two metal layers having mutually different coefficients of thermal expansion, and a plurality of side wall pieces that are provided on said metal layers so as to form a connecting space for said second electronic component, said method comprising;

a first step of extending an aperture of said connecting space formed by said side wall pieces by applying heat to said two metal layers, a second step of inserting a connection member of said second electronic component into said connecting space, and a third step of narrowing said aperture of said connecting space by cooling said two metal layers.

* * * * *